(12) United States Patent
Lai et al.

(10) Patent No.: US 11,800,703 B2
(45) Date of Patent: Oct. 24, 2023

(54) VERTICAL FUSE MEMORY IN ONE-TIME PROGRAM MEMORY CELLS

(71) Applicant: Taiwan Semiconductor Manufacturing Company, Ltd., Hsin-Chu (TW)

(72) Inventors: Sheng-Chih Lai, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/880,754

(22) Filed: Aug. 4, 2022

(65) Prior Publication Data
US 2022/0375949 A1 Nov. 24, 2022

Related U.S. Application Data

(62) Division of application No. 16/885,362, filed on May 28, 2020.
(Continued)

(51) Int. Cl.
*G11C 17/16* (2006.01)
*H10B 20/20* (2023.01)
*G11C 17/18* (2006.01)

(52) U.S. Cl.
CPC ............. *H10B 20/20* (2023.02); *G11C 17/16* (2013.01); *G11C 17/18* (2013.01)

(58) Field of Classification Search
CPC .... H01L 27/11206; H01L 27/11; G11C 17/16
(Continued)

(56) References Cited

U.S. PATENT DOCUMENTS 9,025,367 B1 * 5/2015 Lin ...................... G11C 29/028
                                                    365/158
10,679,685 B2 * 6/2020 Hoang .................... H01L 43/02
(Continued)

OTHER PUBLICATIONS

Balachandran et al."Scalability,Security and Reliability with One-Time Programmable Non-Volatile Memory." Synopsys.The date of publication is unknown.Retrieved online on Dec. 13, 2019 from ittps:/Awww.synopsys.com/designware-ip/technical-bulletin/non-volatile-memory-dwtb-q418html.*
(Continued)

*Primary Examiner* — Muna A Techane
(74) *Attorney, Agent, or Firm* — Eschweiler & Potashnik, LLC

(57) ABSTRACT

In some embodiments, the present disclosure relates to a one-time program memory device that includes a source-line arranged over a bottom dielectric layer. Further, a bit-line is arranged directly over the source-line in a first direction. A channel isolation structure is arranged between the source-line and the bit-line. A channel structure is also arranged between the source-line and the bit-line and is arranged beside the channel isolation structure in a second direction perpendicular to the first direction. A vertical gate electrode extends in the first direction from the bottom dielectric layer to the bit-line and is arranged beside the channel isolation structure in the second direction. The one-time program memory device further includes a gate dielectric layer arranged between the vertical gate electrode and the bit-line, the source-line, and the channel structure.

20 Claims, 14 Drawing Sheets

Related U.S. Application Data

(60) Provisional application No. 62/948,908, filed on Dec. 17, 2019.

(58) Field of Classification Search
USPC .......................................................... 257/379
See application file for complete search history.

(56) References Cited

U.S. PATENT DOCUMENTS

| | | | | |
|---|---|---|---|---|
| 2008/0144347 | A1* | 6/2008 | Takemura | H01L 27/2436 365/63 |
| 2012/0087192 | A1* | 4/2012 | Fang | G11C 16/10 365/185.19 |

OTHER PUBLICATIONS

Balachandran et al. "Scalability, Security and Reliability with One-Time Programmable Non-Volatile Memory." Synopsys. The date of publication is unknown. Retrieved online on Dec. 13, 2019 from https://www.synopsys.com/designware-ip/technical-bulletin/non-volatile-memory-dwtb-q418.html.

Balachandran, Krishna. "The Antifuse Advantage for One-Time Programmable Non-Volatile Memory." Tech Design Forum Techniques. Published on Dec. 14, 2018.

U.S. Appl. No. 16/457,223, filed Jun. 28, 2019.

U.S. Appl. No. 16/509,728, filed Jul. 12, 2019.

Non-Final Office Action dated Sep. 15, 2022 for U.S. Appl. No. 16/885,362.

\* cited by examiner

1500 ⇘

```
┌─────────────────────────────────────────────────────────────────┐
│ Form a first conductive layer over a bottom dielectric layer,   │
│ a first dielectric layer over the first conductive layer, a     │─ 1502
│ second conductive layer over the first dielectric layer, and a  │
│ second dielectric layer over the second conductive layer        │
└─────────────────────────────────────────────────────────────────┘
                                  ↓
┌─────────────────────────────────────────────────────────────────┐
│ Remove outer and middle portion of the first conductive layer,  │
│ the first dielectric layer, the second conductive layer, and    │─ 1504
│ the second dielectric layer to form a first stack of layers and │
│ a second stack of layers spaced apart by a trench               │
└─────────────────────────────────────────────────────────────────┘
                                  ↓
┌─────────────────────────────────────────────────────────────────┐
│ Perform an isotropic removal process to remove outer exposed    │─ 1506
│ portions of the first dielectric layers of the first and        │
│ second stacks of layers                                          │
└─────────────────────────────────────────────────────────────────┘
                                  ↓
┌─────────────────────────────────────────────────────────────────┐
│ Form a channel material directly contacting the first           │─ 1508
│ dielectric layers of the first and second stacks of layers      │
└─────────────────────────────────────────────────────────────────┘
                                  ↓
┌─────────────────────────────────────────────────────────────────┐
│ Remove portions of the channel material that do not directly    │
│ underlie the second dielectric layers of the first and second   │
│ stacks of layers to form channel structures on the first        │─ 1510
│ dielectric layers of the first and second stacks of layers and  │
│ to reopen the trench between the first and second stacks of     │
│ layers                                                           │
└─────────────────────────────────────────────────────────────────┘
                                  ↓
┌─────────────────────────────────────────────────────────────────┐
│ Form a gate dielectric layer on sidewalls of the first and      │─ 1512
│ second stacks of layers                                          │
└─────────────────────────────────────────────────────────────────┘
                                  ↓
┌─────────────────────────────────────────────────────────────────┐
│ Fill the trench with a gate electrode material                  │─ 1514
└─────────────────────────────────────────────────────────────────┘
                                  ↓
┌─────────────────────────────────────────────────────────────────┐
│ Remove portions of the gate dielectric layer and the gate       │─ 1516
│ electrode material that are arranged above the first and        │
│ second stacks of layers                                          │
└─────────────────────────────────────────────────────────────────┘
```

Fig. 15

VERTICAL FUSE MEMORY IN ONE-TIME PROGRAM MEMORY CELLS

REFERENCE TO RELATED APPLICATIONS

This Application is a Divisional of U.S. application Ser. No. 16/885,362, filed on May 28, 2020, which claims the benefit of U.S. Provisional Application No. 62/948,908, filed on Dec. 17, 2019. The contents of the above-referenced Patent Applications are hereby incorporated by reference in their entirety.

BACKGROUND

Many modern day electronic devices include electronic memory. Electronic memory is a device configured to store bits of data in respective memory cells. A memory cell is a circuit configured to store a bit of data, typically using one or more transistors. One type of electronic memory is one-time program (OTP) memory. OTP memory is read-only memory that may only be programmed (e.g., written to) once.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 illustrates a flow diagram of some embodiments of the method illustrated in FIGS. 6-14.

DETAILED DESCRIPTION

Figure 1:
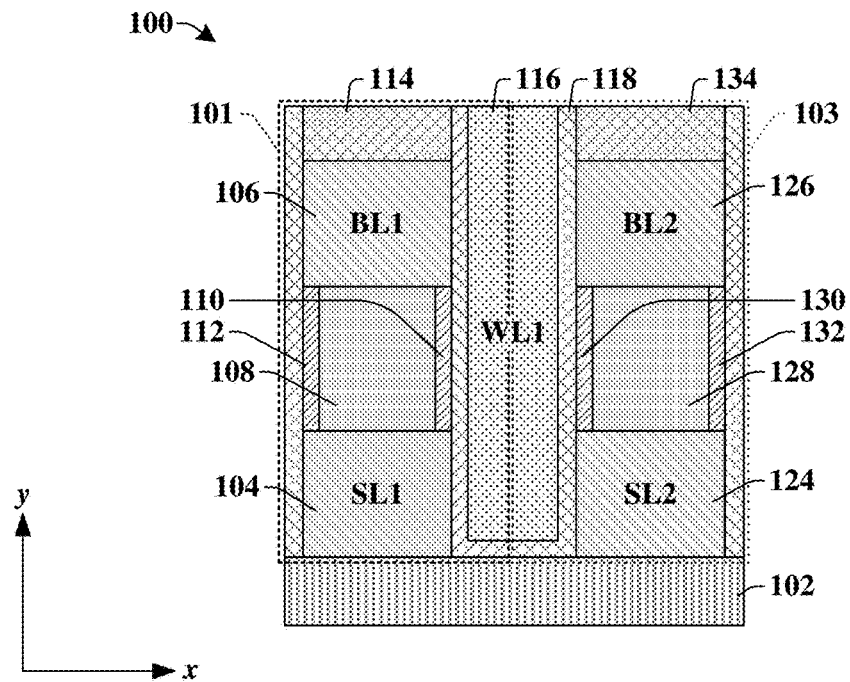
FIG. 1 illustrates a cross-sectional view of some embodiments of an integrated chip having two vertical fuse one-time program (OTP) memory cells sharing a vertical gate electrode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time program (OTP) memory cell may include a fuse transistor comprising a polysilicon or metal fuse and coupled in series with a read transistor. Before being programmed, the OTP memory cell may initially be in a low resistance state (e.g., logical '0') such that the fuse is conductive. After being programmed by the application of a large voltage bias across the fuse, the fuse of the fuse transistor is damaged, which opens the circuit, and the OTP memory cell may be in a high resistance state (e.g., logical '1'). Repairing the broken fuse in the fuse transistor cannot be reversed by a different write operation, and thus, the fuse OTP memory cell can only be programmed (e.g., written to) one time. In such embodiments, the read transistor and the fuse transistor may be planar field effect transistors (FETs). Planar FETs take up a large amount of area on a substrate, thereby decreasing device density on the substrate density (e.g., number of devices per area of substrate). Further, by having two planar FETs per OTP memory cell, device density is also decreased.

Various embodiments in the present disclosure relate to a vertical fuse OTP memory cell to increase device density (e.g., number of devices per area of substrate) at a low-cost manufacturing process. In such embodiments, the vertical fuse OTP memory cell comprises one vertical fuse OTP transistor per vertical fuse OTP memory cell without the use of a read transistor, thereby increasing device density. A first vertical fuse OTP transistor comprises a source region comprising and controlled by a first source line (SL) and a drain region comprising and controlled by a first bit-line (BL). The first BL may directly overlie the first SL such that the first BL and the first SL are vertically arranged to increase device density. A first channel isolation structure is vertically arranged between the first BL and the first SL, and a first channel structure is also vertically arranged between the first BL and the first SL and laterally beside the first channel isolation structure, in some embodiments. A vertical gate electrode that also serves as a first word-line (WL) is arranged laterally next to the first channel structure. In some embodiments, a gate dielectric layer separates a first side of the vertical gate electrode from the first BL, the first SL, and the first channel structure.

In some embodiments, a second channel structure, a second BL, a second SL, and a second channel isolation structure are arranged on a second side of the vertical gate electrode, wherein the second side is opposite to the first side to form a second vertical fuse OTP transistor. Although the first and second vertical fuse OTP transistors share the same vertical gate electrode, the first vertical fuse OTP transistor and the second vertical fuse OTP transistor may be individually operated (e.g., read operation or write operation) by selective use of the first SL, second SL, first BL, and/or second BL. Thus, in some embodiments, a single vertical gate electrode controls at least two vertical fuse OTP transistors and thus, two vertical fuse OTP memory cells, thereby reducing costs and further increasing device density.

FIG. 1 illustrates a cross-sectional view 100 of some embodiments of a vertical fuse OTP memory array comprising a first and second vertical fuse OTP transistors.

The cross-sectional view 100 of FIG. 1 includes a first vertical fuse OTP transistor 101 arranged laterally beside a second vertical fuse OTP transistor 103 in an x-direction. In some embodiments, the first and second vertical fuse OTP transistors 101, 103 are arranged over a bottom dielectric layer 102. In some embodiments, the first vertical fuse OTP transistor 101 and the second vertical fuse OTP transistor 103 share a vertical gate electrode 116, which reduces the size of the first and second OTP transistors 101, 103 and reduces manufacturing costs.

In some embodiments, the first vertical fuse OTP transistor 101 comprises a first source/drain region 104 over the bottom dielectric layer 102, and a second source/drain region 106 arranged directly over the first source/drain region 104 in a y-direction that is perpendicular to the x-direction. In some embodiments, a first channel isolation structure 108 is arranged directly between the first and second source/drain regions 104, 106. Further, in some embodiments, a first channel structure 110 is arranged directly between the first and second source/drain regions 104, 106 in the y-direction and arranged on a first side of the first channel isolation structure 108 in the x-direction. In some embodiments, a second channel structure 112 is arranged directly between the first and second source/drain regions 104, 106 in the y-direction and arranged on a second side of the second channel isolation structure 128 in the x-direction. In such embodiments, the first and second channel structures 110, 112 extend in the y-direction from the first source/drain region 104 to the second source/drain region 106. In some embodiments, a first dielectric isolation structure 114 is arranged directly over the second source/drain region 106. Further, in some embodiments, a gate dielectric layer 118 is arranged on outer sidewalls of the first dielectric isolation structure 114, the first source/drain region 104, the second source/drain region 106, and the first channel isolation structure 108. The first and second channel structures 110, 112 separate the first channel isolation structure 108 from the gate dielectric layer 118.

In some embodiments, the first vertical fuse OTP transistor 101 comprises a vertical gate electrode 116 that is arranged on the first side of the first channel isolation structure 108 in the x-direction. The vertical gate electrode 116 extends from the first source/drain region 104 to the first dielectric isolation structure 114 in the y-direction. Further, the gate dielectric layer 118 directly contacts and covers outer sidewalls and a bottom surface of the vertical gate electrode 116.

In some embodiments, the second vertical fuse OTP transistor 103 comprises a third source/drain region 124 arranged over the bottom dielectric layer 102; a fourth source/drain region 126 arranged directly over the third source/drain region 124; and a second channel isolation structure 128 arranged directly between the third and fourth source/drain regions 124, 126. Further, in some embodiments, a third channel structure 130 is arranged on a second side of the second channel isolation structure 128, and a fourth channel structure 132 is arranged on a first side of the second channel isolation structure 128. In such embodiments, the third and fourth channel structures 130, 132 extend in the y-direction from the third source/drain region 124 to the fourth source/drain region 126. In some embodiments, a second dielectric isolation structure 134 is arranged directly over the fourth source/drain region 126. In some embodiments, the gate dielectric layer 118 surrounds outer sidewalls of the third source/drain region 124, the fourth source/drain region 126, the third channel structure 130, the fourth channel structure 132, and the second dielectric isolation structure 134. The second vertical fuse OTP transistor 103 also comprises the vertical gate electrode 116.

In some embodiments, to reduce the size of the first and second OTP transistors 101, 103 and to simplify the manufacturing process, the first source/drain region 104, the second source/drain region 106, the third source/drain region 124, and the fourth source/drain region 126 may also serve as a first source-line SL1, a first bit-line BL1, a second source-line SL2, and a second bit-line BL2, respectively. Further, in such embodiments, the vertical gate electrode 116 may serve as a first word-line WL1. In such embodiments, the first vertical fuse OTP transistor 101 may be operated (e.g., read from or written to) by selectively operating the first bit-line BL1, the first source-line SL1, and the first word-line WL1 to apply a bias across the first channel structure 110. Similarly, in such embodiments, the second vertical fuse OTP transistor 103 may be operated (e.g., read from or written to) for by selectively operating the second bit-line BL2, the second source-line SL2 and the first word-line WL1 to apply a bias across the third channel structure 130. In some embodiments like FIG. 1, because the second and fourth channel structures 112, 132 are not arranged near the vertical gate electrode 116, the second and fourth channel structures 112, 132 are not involved in data storage.

Further, the first vertical fuse OTP transistor 101 may correspond to a first vertical OTP fuse memory cell, and the second vertical fuse OTP transistor 103 may correspond to a second vertical OTP fuse memory cell. Thus, the first and second vertical OTP fuse memory cells do not comprise a read transistor and a fuse transistor, which also reduces the size of the overall device.

Figure 2:
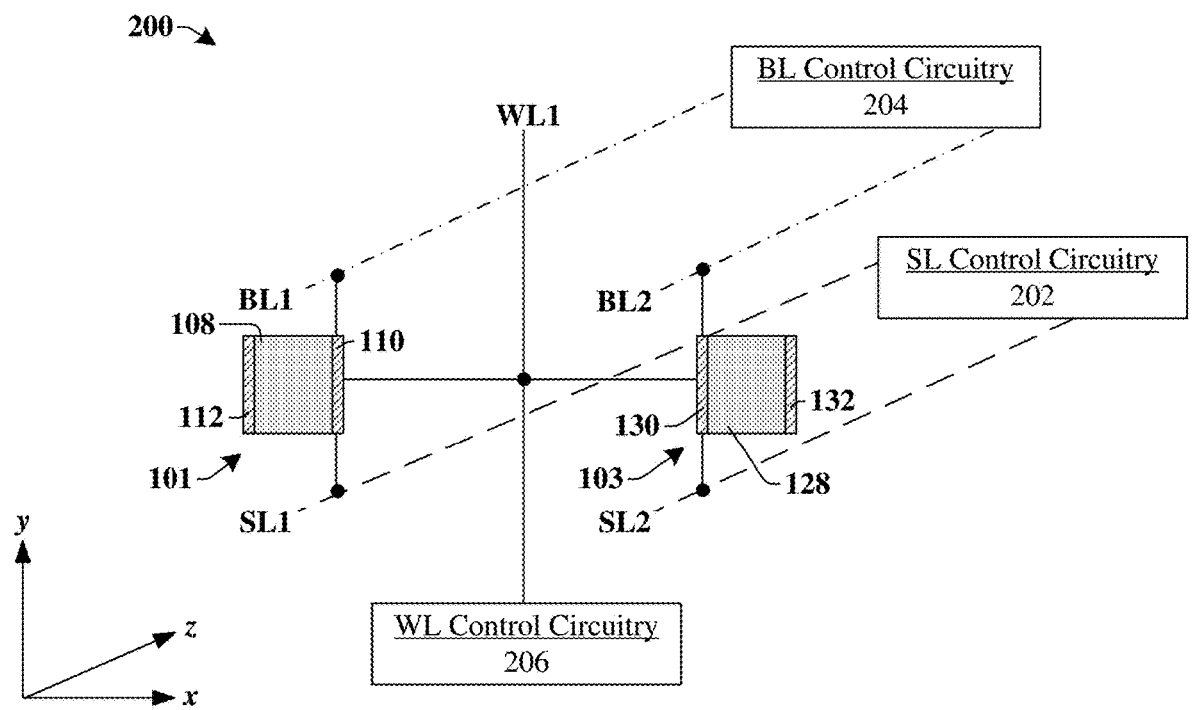
FIG. 2 illustrates a schematic of some embodiments of a first vertical fuse OTP transistor and a second vertical fuse OTP transistor coupled to same word-line.

FIG. 2 illustrates a schematic 200 of some embodiments of the first and second transistors coupled to control circuitry.

In some embodiments, the bit-lines (e.g., BL1, BL2) and the source-lines (e.g., SL1, SL2) extend in a z-direction. The z-direction is perpendicular to the x-direction and to the y-direction. Further, in some embodiments, the first bit-line BL1 may be spaced apart from the first source-line SL1 in the y-direction and spaced apart from the second bit-line BL2 in the x-direction. In some embodiments, the first word-line WL1 may extend in the y-direction. As illustrated in FIG. 2, the first channel structure 110 of the first vertical fuse OTP transistor 101 and the third channel structure 130 of the second vertical fuse OTP transistor 103 are coupled to the first word-line WL1, whereas the second channel structure 112 of the first vertical fuse OTP transistor 101 and the fourth channel structure 132 of the second vertical fuse transistor 103 are not coupled to the first word-line WL1.

It will be appreciated that the first bit-line BL1 and the first source-line SL1 are coupled to both the first and second channel structures 110, 112 of the first vertical fuse OTP transistor 101 as illustrated in FIG. 1. However, for ease of illustration, because the first channel structure 110 of the first vertical fuse OTP transistor 101 is involved in data storage whereas the second channel structure 112 of the first vertical fuse OTP transistor 101 is not involved in data storage, the first bit-line BL1 and the first source-line SL1 are coupled to the first channel structure 110 of the first vertical fuse OTP transistor 101 in FIG. 2. Similarly, the second bit-line BL2 and the second SL2 are coupled to the third channel structure 130 of the second vertical fuse OTP transistor 103 in FIG. 2.

Further, as illustrated in the schematic 200 of FIG. 2, the first and second source-lines SL1, SL2 are coupled to source-line (SL) control circuitry 202; the first and second bit-lines BL1, BL2 are coupled to bit-line (BL) control circuitry 204; and the first word-line WL1 is coupled to word-line (WL) control circuitry 206. The SL control circuitry 202, the BL control circuitry 204, and the WL control circuitry 206 can selectively operate signals (e.g., voltage, current) to the source-lines (SL1, SL2), the bit-lines (BL1, BL2), and/or the word-line (WL1), respectively, to perform read and write operations to the first vertical fuse OTP transistor 101 or the second vertical fuse OTP transistor 103.

After manufacturing and before programming the first and second vertical fuse OTP transistors 101, 103, the first and second vertical fuse OTP transistors 101, 103 are in a low resistance memory state (e.g., a logical '0'), wherein the first through fourth channel structures 110, 112, 130, 132 are substantially conductive and undamaged. To program the first vertical fuse OTP transistor 101, for example, a write operation may be selectively applied to the first vertical fuse OTP transistor 101 while the second vertical fuse OTP transistor 103 remains "OFF." To perform the write operation to the first vertical fuse OTP transistor 101, the WL control circuitry 206 applies a first write signal (e.g., current, voltage) to the first word-line WL1; the BL control circuitry 204 selectively applies a second write signal (e.g., current, voltage) to the first bit-line BL1 and not the second bit-line BL2; and the SL control circuitry 202 applies a third write signal (e.g., current, voltage) to the first source-line SL1 and not the second source-line SL2. In some embodiments, the first source-line SL1 is grounded. Based on the first, second, and third write signals, a high-bias signal is applied across and travels through the first channel structure 110 of the first vertical fuse OTP transistor 101 to physically damage and break the fuse in the first channel structure 110, thereby changing the first channel structure 110 from a low resistance state (e.g., a logical '0') to a high resistance state (e.g., a logical '1'). The physical damage associated with the high resistance state (e.g., a logical '1') is substantially irreversible, and thus, the first vertical fuse OTP transistor 101 can only be written to once. Advantageously, because the physical damage is substantially irreversible, the first OTP memory cell (i.e., the first vertical fuse OTP transistor 101) may reliably retain the high resistance state (e.g., a logical '1') for long periods of time and under high temperatures (e.g., greater than 150 degrees Celsius).

To perform a read operation on the second vertical fuse OTP transistor 103, for example, the WL control circuitry 206 applies a first read signal (e.g., current, voltage) to the first word-line WL1; the BL control circuitry 204 selectively applies a second read signal (e.g., current, voltage) to the second bit-line BL2 and not the first bit-line BL1; and the SL control circuitry 202 applies a third read signal (e.g., current, voltage) to the second source-line SL2 and not the first source-line SL2. Based on the first, second, and third read signals, a low-bias is applied across the third channel structure 130 of the second vertical fuse OTP transistor 103 that does not physically damage the third channel structure 130, and thus, the memory state (e.g., high resistance state corresponding to a logical '1' or a low resistance state corresponding to a logical '0') may be read from the second vertical fuse OTP transistor 103.

Thus, the first and second vertical fuse OTP transistors 101, 103 may share a same first word line WL1 (i.e., the vertical gate electrode 116 of FIG. 1) to increase device density and may be reliably and selectively operated by the SL, BL, and WL control circuitry 202, 204, 206. It will be appreciated that more vertical fuse OTP transistors and/or more source-lines, bit-lines, and word-lines than what is illustrated in the schematic 200 of FIG. 2 are also within the scope of the disclosure.

Figure 3:
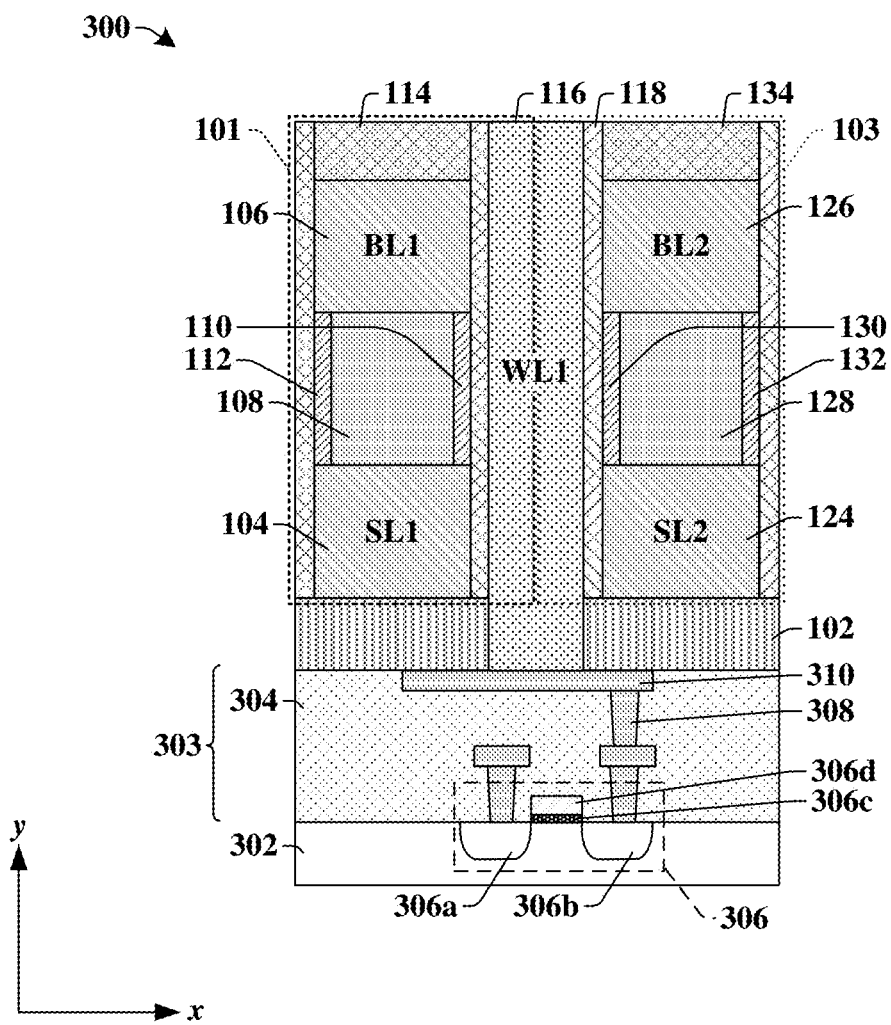
FIG. 3 illustrates a cross-sectional view of some embodiments of vertical fuse OTP memory cells arranged over an interconnect structure.

FIG. 3 illustrates a cross-sectional view 300 of some embodiments of the first and second vertical fuse transistors 101, 103 arranged over an interconnect structure.

In some embodiments, the bottom dielectric layer 102 is arranged directly over an interconnect structure 303 comprising interconnect vias 308 and interconnect wires 310 embedded in an interconnect dielectric structure 304. The interconnect structure 303 is arranged over a substrate 302. In some embodiments, a semiconductor device 306 is arranged on or within the substrate 302 and is coupled to the interconnect vias 308 and the interconnect wires 310. For example, in some embodiments, the semiconductor device 306 may be or comprise a transistor device such as a metal oxide semiconductor field effect transistor (MOSFET). In such embodiments, the semiconductor device 306 may comprise a first MOSFET source/drain region 306a and a second MOSFET source/drain region 306b on or within the substrate 302, wherein a MOSFET gate electrode 306d is arranged over the substrate 302 and between the first and second MOSFET source/drain regions 306a, 306b. In some embodiments, a MOSFET gate dielectric layer 306c is arranged directly between the substrate 302 and the MOSFET gate electrode 306d. It will be appreciated that in some other embodiments, the semiconductor device 306 may be, for example, some other type of transistor such as, for example, a fin field-effect transistor, a nanosheet field effect transistor, or some other suitable transistor.

In some embodiments, the vertical gate electrode 116 extends through the bottom dielectric layer 102 to directly contact an interconnect wire 310 of the interconnect structure 303. In such embodiments, the interconnect structure 303 and the semiconductor device 306 may correspond to at least a portion of the WL control circuitry (206 of FIG. 2). In other embodiments, an interconnect structure 303 and/or semiconductor devices 306 may be arranged over the vertical gate electrode WL1.

Further, in some embodiments, the first source-line SL1, the first bit-line BL1, the second source-line SL2, and the second bit-line BL2 may comprise a same material such as, for example, doped polysilicon, tungsten, cobalt, nickel, nickel platinum, titanium nitride, or some other suitable material. In some embodiments, the first word-line WL1 may comprise a semiconductor material such as polysilicon or a conductive material such as, for example, titanium nitride, tungsten, or some other suitable conductive material. In some embodiments, the first, second, third, and fourth channel structures 110, 112, 130, 132 may comprise a same material, such as, for example, polysilicon, molybdenum sulfide, tungsten selenide, molybdenum selenide, indium gallium zinc oxide, or some other suitable semiconductor material.

In some embodiments, the gate dielectric layer 118 may comprise silicon dioxide or a high-k dielectric material, such as, for example, hafnium oxide, zirconium-doped hafnium oxide, aluminum oxide, lanthanum oxide, or some other suitable high-k dielectric material. In some embodiments, the bottom dielectric layer 102, the first and second channel isolation structures 108, 128, and the first and second dielectric isolation structures 114, 134 comprise the same and/or different dielectric materials such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, for example, the first and second channel isolation structures 108, 128 are selectively patterned, and thus, the first and second channel isolation structures 108, 128 comprise a different dielectric material than the bottom dielectric layer 102 and the first and second dielectric isolation structures 114, 134.

Figure 4:
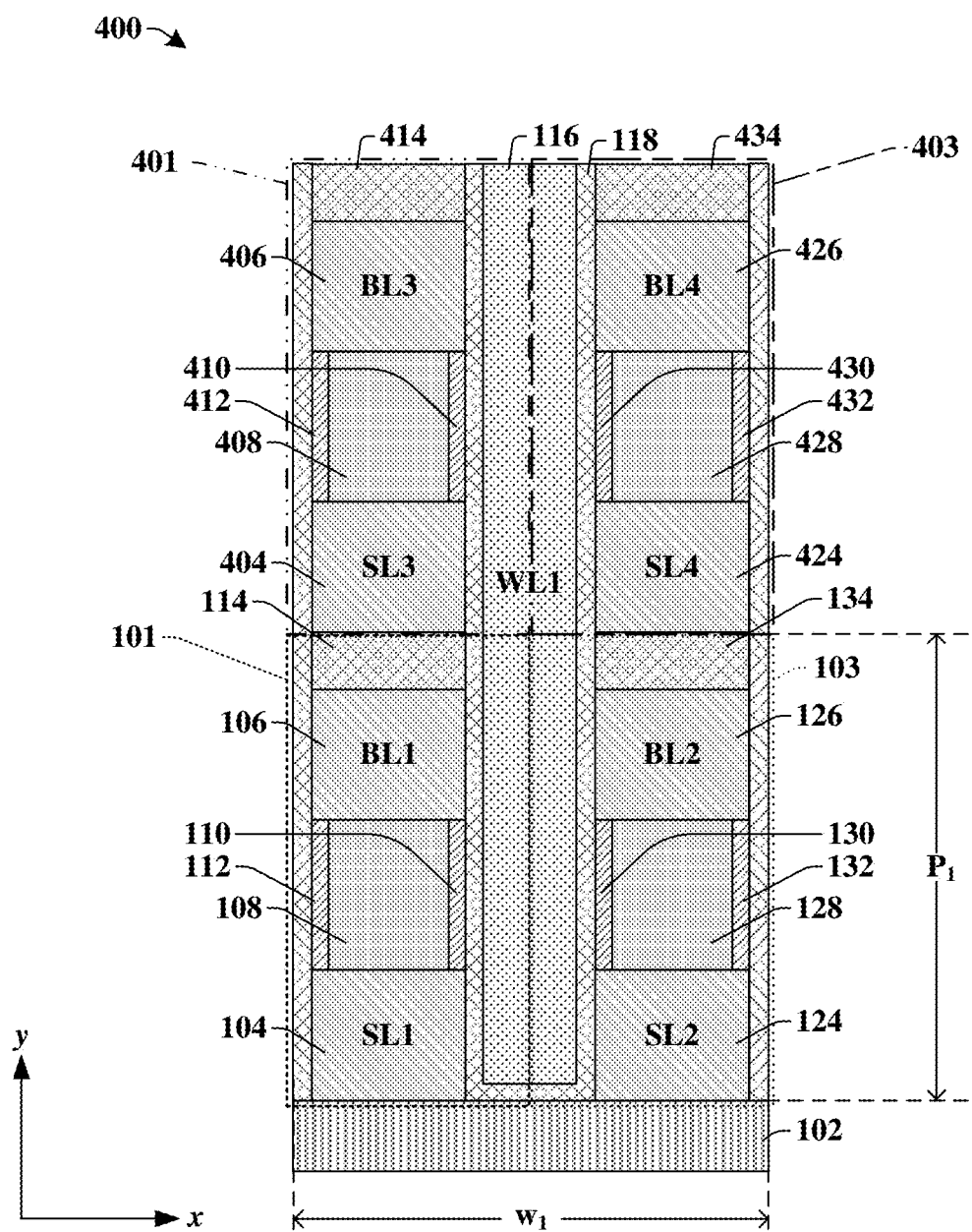
FIG. 4 illustrates a cross-sectional view of some embodiments of vertical fuse OTP memory cells arranged in a 2 by 2 vertical fuse OTP memory array.

FIG. 4 illustrates a cross-sectional view 400 of some embodiments of a vertical fuse OTP memory array arranged in a 2 by 2 OTP memory cell orientation.

In some embodiments, a third vertical fuse OTP transistor 401 is arranged directly over the first vertical fuse OTP transistor 101, and a fourth vertical fuse OTP transistor 403 is arranged directly over the second vertical fuse OTP transistor 103. In such embodiments, the third vertical fuse OTP transistor 401 corresponds to a third OTP memory cell, and the fourth vertical fuse OTP transistor 403 corresponds to the resulting OTP memory array comprises 2 vertical fuse OTP memory cells by 2 vertical fuse OTP memory cells. In some embodiments, the vertical gate electrode 116 extends in the y-direction directly between the first and second vertical fuse OTP transistors 101, 103 and directly between the third and fourth vertical fuse OTP transistors 401, 403. Thus, in some embodiments, the same vertical gate electrode 116 and thus, the same first word-line WL1, is shared amongst four vertical gate transistors (e.g., 101, 103, 401, 403).

In some embodiments, the third vertical fuse OTP transistor 401 comprises a fifth source/drain region 404, which corresponds to a third source-line SL3, that is arranged directly over the first dielectric isolation structure 114. Further, the third vertical fuse OTP transistor 401 comprises, in some embodiments, a fifth channel structure 410 arranged on a first side of a third channel isolation structure 408, and a sixth channel structure 412 arranged on a second side of the third channel isolation structure 408. In some embodiments, the third channel isolation structure 408 and the fifth and sixth channel structures 410, 412 are arranged directly between the fifth source/drain region 404/the third source-line SL3 and a sixth source/drain region 406 that corresponds to a third bit-line BL3. In some embodiments, a third dielectric isolation structure 414 is arranged directly over the third bit-line BL3. Further, in some embodiments, the fifth channel structure 410 is arranged directly between the third bit-line BL3 and the third source-line SL3 in the y-direction and is arranged directly between the third channel isolation structure 408 and the first word-line WL1 in the x-direction. Thus, the third vertical fuse OTP transistor 401 may be operated by selectively applying signals (e.g., currents, voltages) to the third bit-line BL3, the third source-line SL3, and the first word-line WL1 without applying signals to the first, second, and fourth bit-lines or source-lines BL1, BL2, BL4, SL1, SL2, SL4.

In some embodiments, the fourth vertical fuse OTP transistor 403 comprises a seventh source/drain region 424, which corresponds to a fourth source-line SL4, that is arranged directly over the second dielectric isolation structure 134. Further, the fourth vertical fuse OTP transistor 403 comprises, in some embodiments, a seventh channel structure 430 arranged on a second side of a fourth channel isolation structure 428, and an eighth channel structure 432 arranged on a first side of the fourth channel isolation structure 428. In some embodiments, the fourth channel isolation structure 428 and the seventh and eighth channel structures 430, 432 are arranged directly between the seventh source/drain region 424/the fourth source-line SL4 and an eighth source/drain region 426 that corresponds to a fourth bit-line BL4. In some embodiments, a fourth dielectric isolation structure 434 is arranged directly over the third bit-line BL3. Further, in some embodiments, the seventh channel structure 430 is arranged directly between the fourth bit-line BL4 and the fourth source-line SL4 in the y-direction and is arranged directly between the fourth channel isolation structure 428 and the first word-line WL1 in the x-direction. Thus, the fourth vertical fuse OTP transistor 403 may be operated by selectively applying signals (e.g., currents, voltages) to the fourth bit-line BL4, the fourth source-line SL4, and the first word-line WL1 without applying signals to the first, second, and third bit-lines or source-lines BL1, BL2, BL3, SL1, SL2, SL3.

Thus, it will be appreciated that multiple vertical fuse transistors may be vertically stacked upon one another and sharing a same word line to reduce the size of a vertical fuse OTP memory array in at least the y-direction. Further, in some embodiments, each vertical fuse OTP transistor (e.g., 101, 103, 401, 403) may have a first pitch $P_1$ measured in the y-direction from a bottom surface of the source line (e.g., SL1, SL2, SL3, SL4) to a top surface of the dielectric isolation structure (e.g., 114, 134, 414, 434). In some embodiments, the first pitch $P_1$ may be in a range of between, for example, 50 nanometers and approximately 250 nanometers. Further, in some embodiments of a vertical fuse OTP memory array, the memory array may have a first width $w_1$ measured between outermost sidewalls of the gate dielectric layer 118 in the x-direction. Further, in such embodiments, the first width $w_1$ may include two vertical fuse OTP transistors (e.g., 101 and 103, 401 and 403), In some embodiments, the first width $w_1$ may be in a range of between, for example, approximately 90 nanometers and approximately 250 nanometers. It will be appreciated that other values for the first pitch $P_1$ and the first width $w_1$ are also within the scope of the disclosure.

Figure 5:
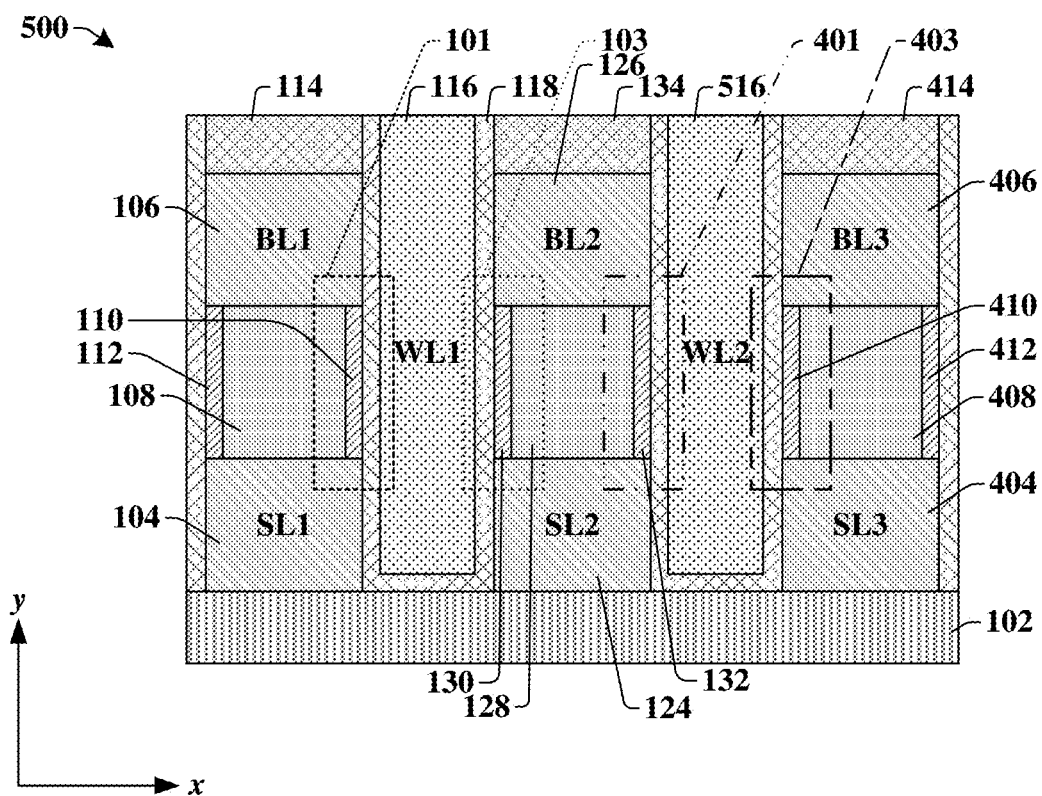
FIG. 5 illustrates a cross-sectional view of some embodiments of vertical fuse OTP memory cells arranged in a 4 by 1 vertical fuse OTP memory array.

FIG. 5 illustrates a cross-sectional view 500 of some embodiments of a vertical fuse OTP memory array arranged in a 4 by 1 OTP memory cell orientation.

In some embodiments, a second vertical gate electrode 516 that corresponds to a second word-line WL2 may be arranged on the first side of the second channel isolation structure 128 and extends from the bottom dielectric layer 102 to the second dielectric isolation structure 134 in the y-direction. Further, in such embodiments, the gate dielectric layer 118 may separate the second source-line SL2, the fourth channel structure 132, the second bit-line BL2, and the second dielectric isolation structure 134 from the second word-line WL2. In such embodiments, a third vertical fuse OTP transistor 401 may be horizontally arranged beside the second vertical fuse OTP transistor 103 in the x-direction, wherein the third vertical fuse OTP transistor 401 is operated by applying a bias across the fourth channel structure 132 based on signals (e.g., currents, voltages) from the second source-line SL2, the second bit-line BL2, and the second word-line WL2. Thus, in such embodiments, the fourth channel structure 132 is used for data storage.

Further, in some embodiments, the third source-line SL3 and the third bit-line BL3 may be arranged beside the second word-line WL2 in the x-direction. In some embodiments, the fifth channel structure 410 is arranged beside the second word-line WL2 in the x-direction, and the third channel isolation structure 408 is arranged between the fifth channel structure 410 and the sixth channel structure 412. In such embodiments, a fourth vertical fuse OTP transistor 403 may be horizontally arranged beside the third vertical fuse OTP transistor 401 in the x-direction, wherein the fourth vertical fuse OTP transistor 403 is operated by applying a bias across the fifth channel structure 410 based on signals (e.g., currents, voltages) from the third source-line SL3, the third bit-line BL3, and the second word-line WL2.

In some embodiments, the resulting OTP memory array illustrated in FIG. 5 comprises 4 vertical fuse OTP memory cells by 1 vertical fuse OTP memory cells. In such embodiments, the second and third vertical fuse OTP transistors 103, 401 may share the second bit-line BL2 and the second source-line SL2. In some embodiments, reliable and selective control of the second vertical fuse OTP transistor 103 versus the third vertical fuse OTP transistor 401 may be difficult to achieve. Thus, in some other embodiments (not shown), an isolation structure may extend completely through the second dielectric isolation structure, the second bit-line BL2, the second channel isolation structure 128, and the second source-line SL2 such that the second and third vertical fuse OTP transistors 103, 401 do not share the same second source-line SL2 and the same second bit-line BL2, and thus, may be individually operated more reliably.

FIGS. 6-14 illustrate cross-sectional views 600-1400 of some embodiments of a method of forming a vertical fuse OTP memory array. Although FIGS. 6-14 are described in relation to a method, it will be appreciated that the structures disclosed in FIGS. 6-14 are not limited to such a method, but instead may stand alone as structures independent of the method.

As shown in cross-sectional view 600, in some embodiments, a first conductive layer 602 is formed over a bottom dielectric layer 102; a first dielectric layer 604 is formed over the first conductive layer 602; a second conductive layer 606 is formed over the first dielectric layer 604; a second dielectric layer 608 is formed over the second conductive layer 606; a third conductive layer 610 is formed over the second dielectric layer 608; a third dielectric layer 612 is formed over the third conductive layer 610; a fourth conductive layer 614 is formed over the third dielectric layer 612; and a fourth dielectric layer 616 is formed over the fourth conductive layer 614. Further, in some embodiments, the bottom dielectric layer 102 is formed over a substrate and/or interconnect structure, as shown in the cross-sectional view 300 of FIG. 3, for example. In some embodiments, the bottom dielectric layer 102, the first conductive layer 602, the first dielectric layer 604, the second conductive layer 606, the second dielectric layer 608, the third conductive layer 610, the third dielectric layer 612, the fourth conductive layer 614, and the fourth dielectric layer 616 may each be formed by way of deposition processes (e.g., chemical vapor deposition (CVD), physical vapor deposition (PVD), atomic layer deposition (ALD), etc.).

In some embodiments, the bottom dielectric layer 102, the first dielectric layer 604, the second dielectric layer 608, and the third dielectric layer 612, and the fourth dielectric layer 616 each comprise a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the first dielectric layer 604 and the third dielectric layer 612 comprise a same dielectric material that is different than dielectric materials of the bottom dielectric layer 102, the second dielectric layer 608, and the fourth dielectric layer 616.

In some embodiments, the first, second, third, and fourth conductive layers 602, 606, 610, 614 comprise a same material such as, for example, doped polysilicon, tungsten, cobalt, nickel, nickel platinum, titanium nitride, or some other suitable conductive material. In other embodiments, the first and third conductive layers 602, 610 may comprise a first conductive material, whereas the second and fourth conductive layers 606, 614 may comprise a second conductive material different than the first conductive material.

Figure 7:
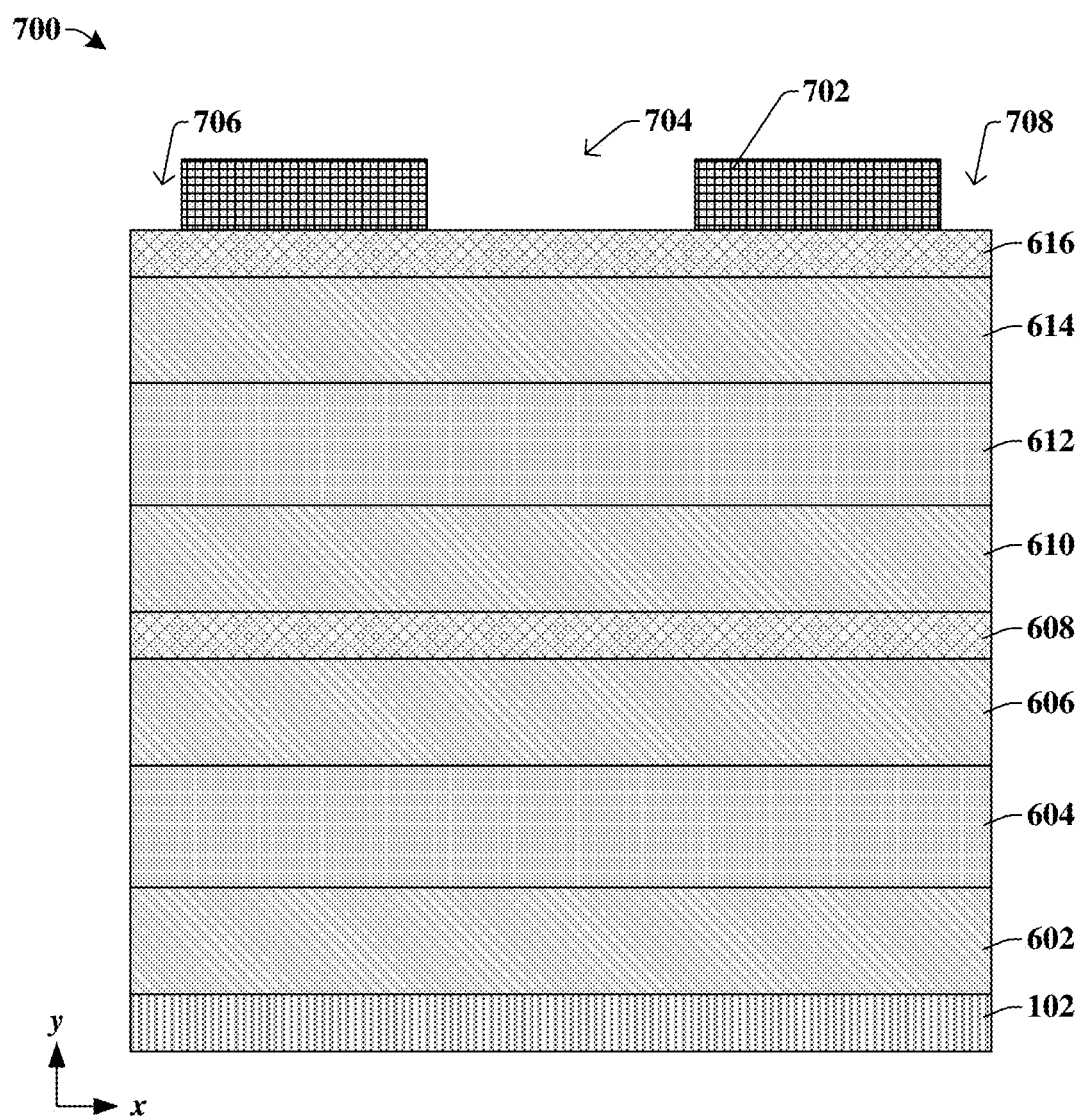

As shown in cross-sectional view 700 of FIG. 7, in some embodiments, a masking structure 702 is formed over the fourth dielectric layer 616. In some embodiments, the masking structure 702 may be formed using photolithography and removal (e.g., etching) processes. In some embodiments, the masking structure 702 comprises a photoresist material or a hard mask material. Further, in some embodiments, the masking structure 702 comprises a first opening 704 over a center portion of the fourth dielectric layer 616 and comprises second and third openings 706, 708 over outer portions of the fourth dielectric layer 616.

Figure 8:
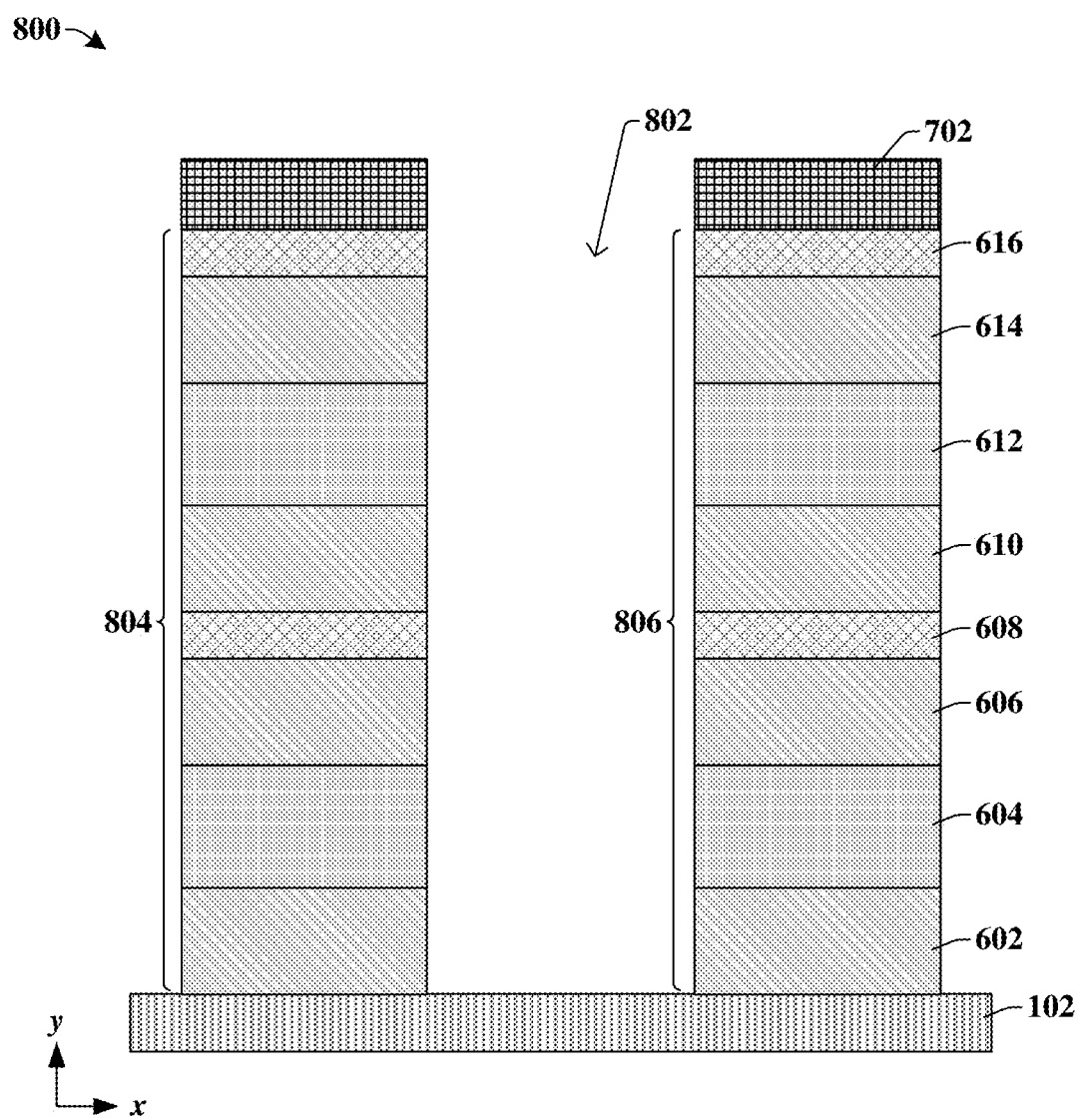

As shown in cross-sectional view 800 of FIG. 8, a first removal process is performed to remove portions of the first through fourth conductive layers 602, 606, 610, 614 and the first through fourth dielectric layers 604, 608, 612, 616 that do not directly underlie the masking structure 702. In some embodiments, the first removal process is an etching process that is substantially vertical in the y-direction. Thus, in some embodiments, the first removal process may comprise a vertical dry etching process, for example. In some embodiments, the first removal process does not remove the bottom dielectric layer 102. In some embodiments, the bottom dielectric layer 102 may comprise a material substantially resistant to removal by the first removal process, or removal of the bottom dielectric layer 102 is prevented by etch time control.

After the first removal process of FIG. 8, a first stack of layers 804 and a second stack of layers 806 are formed over the bottom dielectric layer 102 and are spaced apart from one another by a trench 802. The trench 802 of FIG. 8 underlies the first opening 704 of FIG. 7 in the masking structure 702.

Figure 9:
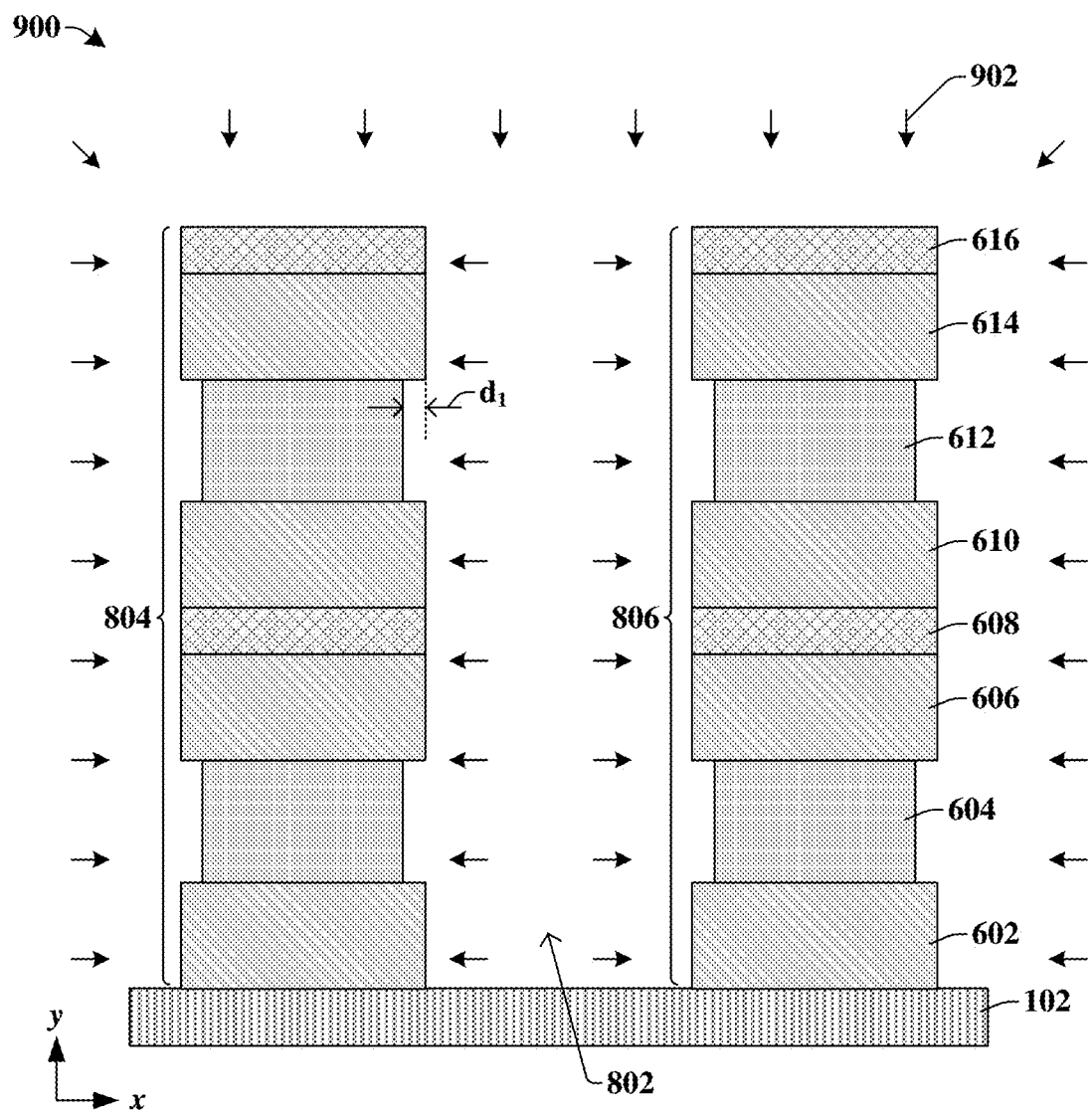

As shown in cross-sectional view 900 of FIG. 9, in some embodiments, a second removal process 902 is performed to selectively remove outer portions of the first and third dielectric layers 604, 612 of the first and second stacks of layers 804, 806 in the x-direction. In such embodiments, the second removal process 902 may be a substantially isotropic removal process in order to remove the outer portions of the first and third dielectric layers 604, 612 in the x-direction. In such embodiments, the second removal process 902 may comprise an isotropic dry or wet etchant. Further, the second removal process 902 removes the outer portions of the first and third dielectric layers 604, 612 without removing other portions of other exposed layers (e.g., 102, 602, 606, 608, 610, 614, 616) in the first and second stacks of layers 804, 806. Thus, in some embodiments, the first and third dielectric layers 604, 612 may comprise a different material than the other layers in FIG. 9 such that the outer portions of the first and third dielectric layers 604, 612 may be selectively removed by the second removal process 902. Further, in some embodiments, the second removal process 902 removes about a first distance di of the outer portions of the first and third dielectric layers 604, 612 that is measured in the x-direction. In some embodiments, the first distance di may be in a range of between approximately 5 nanometers and approximately 50 nanometers.

Further, in some embodiments, the masking structure (702 of FIG. 8) may be removed before the second removal process 902. In other embodiments, the masking structure (702 of FIG. 8) may remain on the first and second stacks of layers 804, 806 during and after the second removal process 902. In such other embodiments, the masking structure (702 of FIG. 8) may be removed in a later step of the method.

Figure 10:
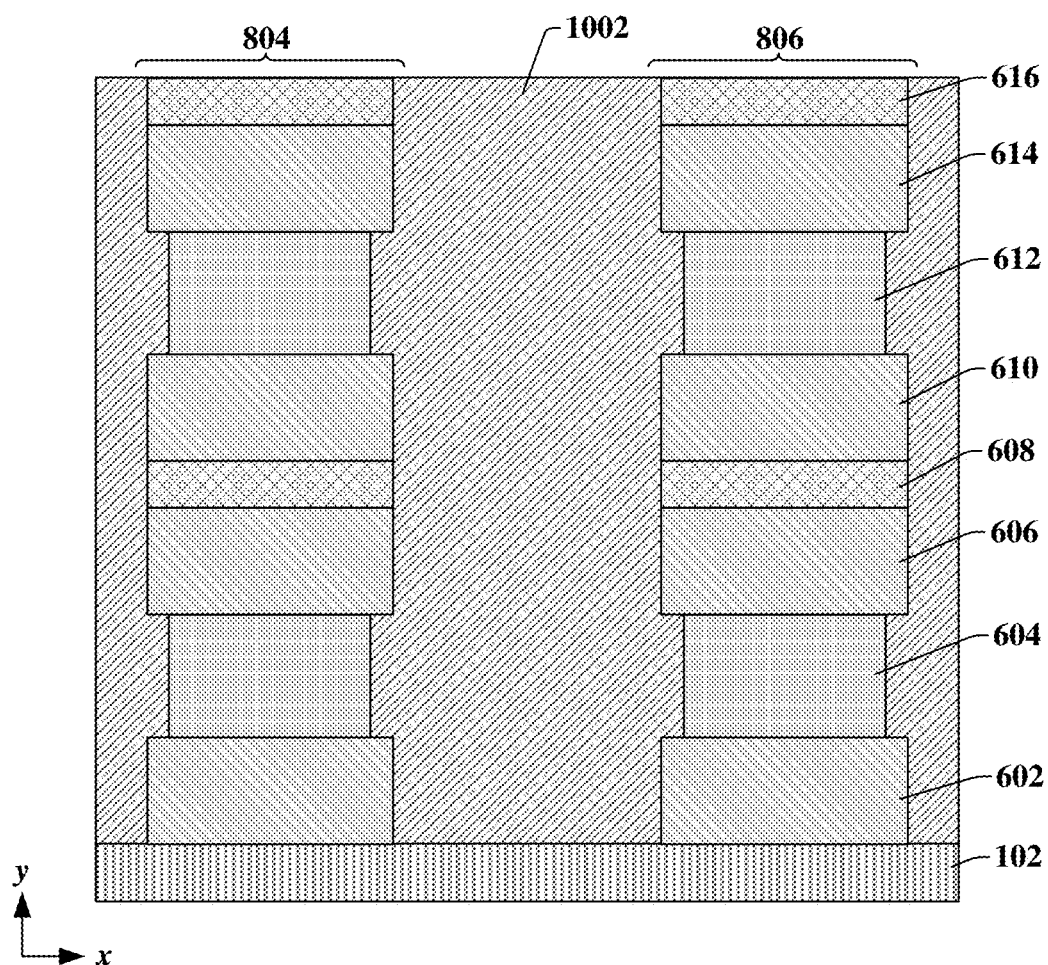

As shown in cross-sectional view 1000 of FIG. 10, in some embodiments, a channel material 1002 may be formed over the bottom dielectric layer 102 and directly contacting outer surfaces of the first and third dielectric layers 604, 612. In some embodiments, the channel material 1002 may be formed by way of a deposition process (e.g., CVD, PVD, PE-CVD, ALD, sputtering, etc.). In some embodiments, the channel material 1002 completely fills the trench (802 of FIG. 8) between the first and second stacks of layers 804, 806. In other embodiments, the channel material 1002 may exhibit more of a conformal layer over and around the first and second stacks of layers 804, 806 and thus, not completely fill the trench (802 of FIG. 8). Further, in some embodiments, the channel material 1002 comprises polysilicon, molybdenum sulfide, tungsten selenide, molybdenum selenide, indium gallium zinc oxide, or some other suitable semiconductor material.

Figure 11:
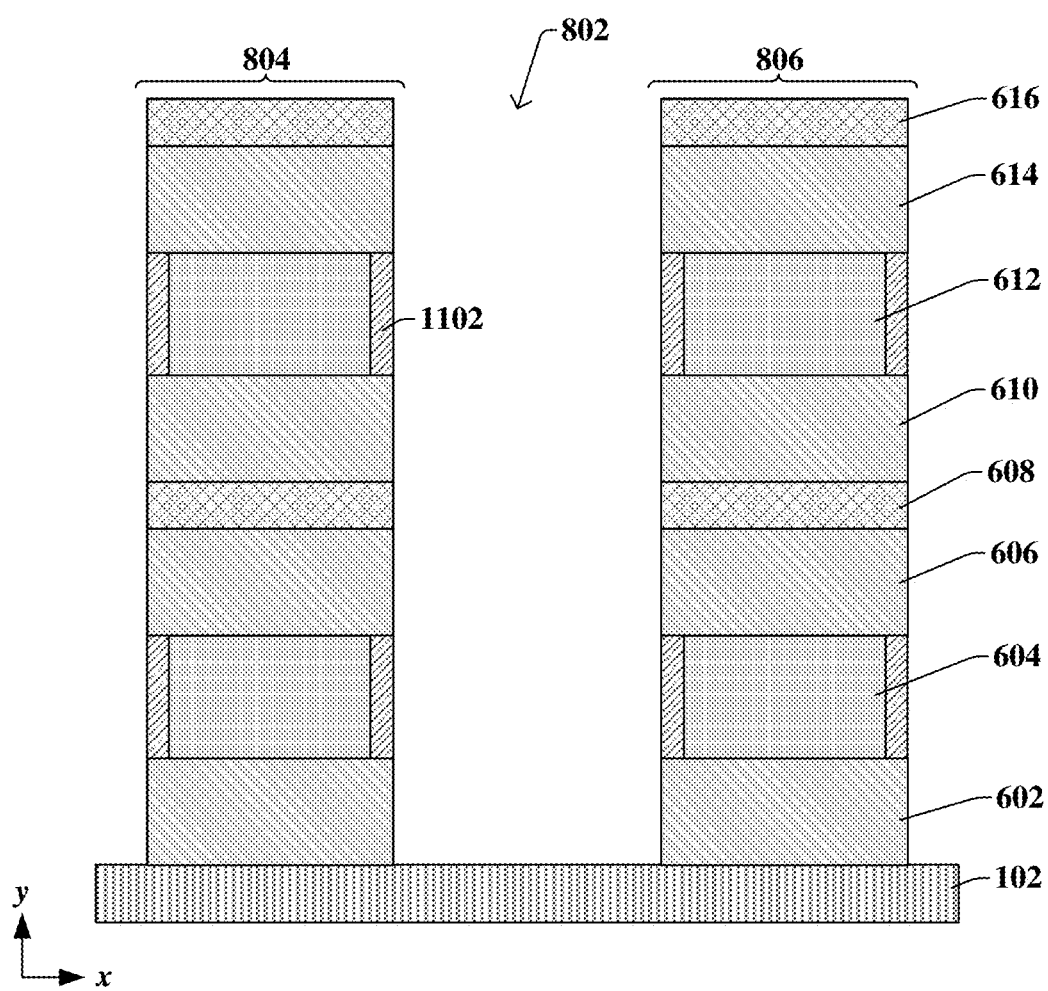

As shown in cross-sectional view 1100 of FIG. 11, a third removal process may be performed to remove portions of the channel material (1002 of FIG. 10) that do not directly underlie the fourth dielectric layer 616 of the first and second stacks of layers 804, 806. In such embodiments, the remaining channel material (1002 of FIG. 10) forms channel structures 1102 that are arranged on outer sidewalls of the first and third dielectric layers 604, 612 and that directly underlie the fourth dielectric layer 616 of the first or second stacks of layers 804, 806. In some embodiments, the third removal process may comprise an etching process conducted in the y-direction. Further, in some embodiments, the masking structure (702 of FIG. 8) is used to protect the fourth dielectric layer 616 from the third removal process, whereas in other embodiments, a masking structure is not used, and the third removal process does not affect or does not significantly affect the fourth dielectric layer 616. After formation, the channel structures 1102 are substantially conductive and thus, are in a low resistive state.

Figure 12:
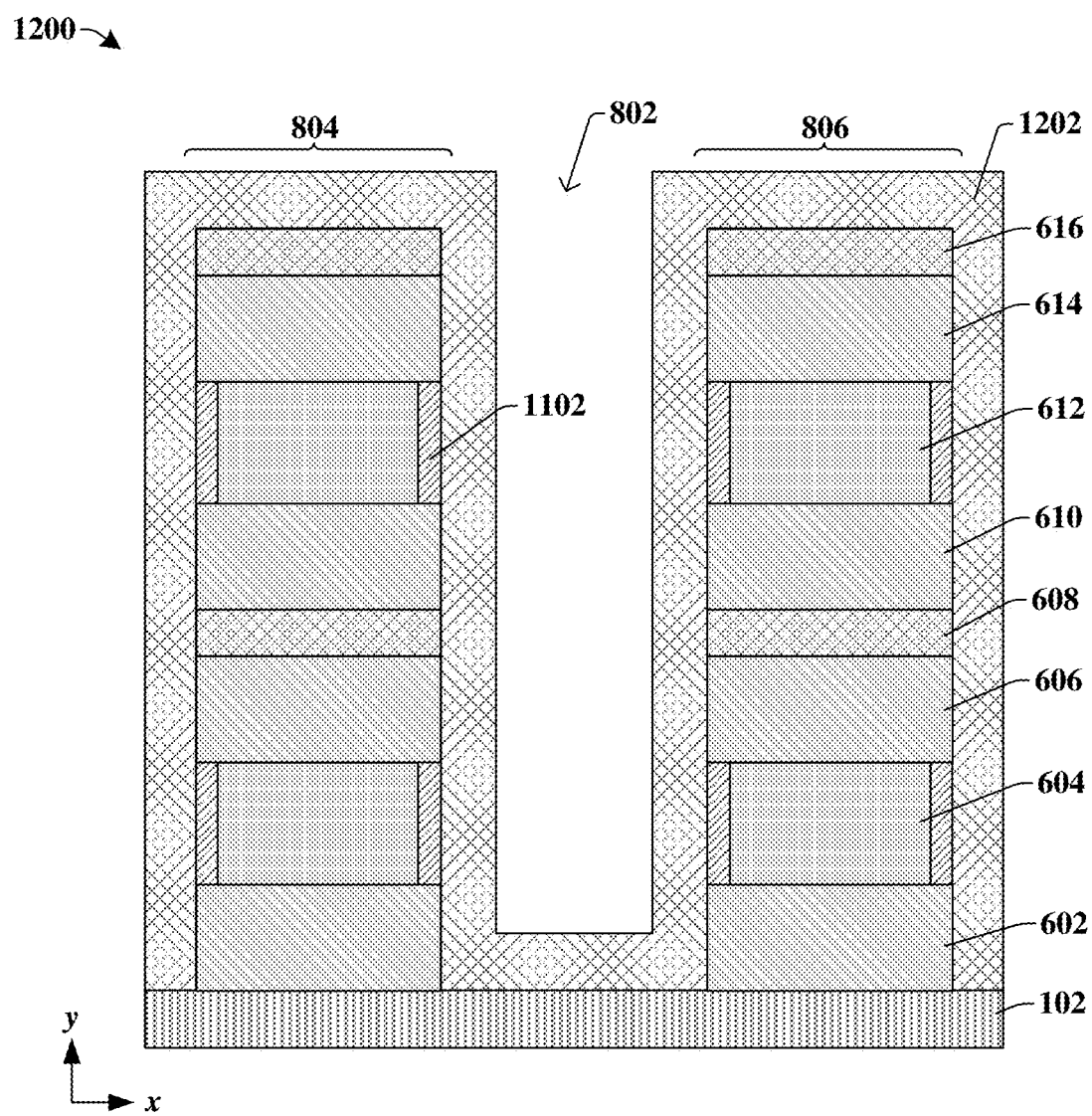

As shown in cross-sectional view 1200 of FIG. 12, in some embodiments, a gate dielectric material 1202 is formed over and around the first and second stacks of layers 804, 806. In some embodiments, the gate dielectric material 1202 is a substantially conformal layer and is formed by way of a deposition process (e.g., CVD, PVD, PE-CVD, ALD, sputtering, etc.). In some embodiments, the gate dielectric material 1202 does not completely fill the trench 802, and thus, the trench 802 of FIG. 12 is defined by surfaces of the gate dielectric material 1202 arranged between the first and second stacks of layers 804, 806. In some embodiments, the gate dielectric material 1202 comprises, for example, silicon dioxide or a high-k dielectric material, such as, for example, hafnium oxide, zirconium-doped hafnium oxide, aluminum oxide, lanthanum oxide, or some other suitable high-k dielectric material.

Figure 13:
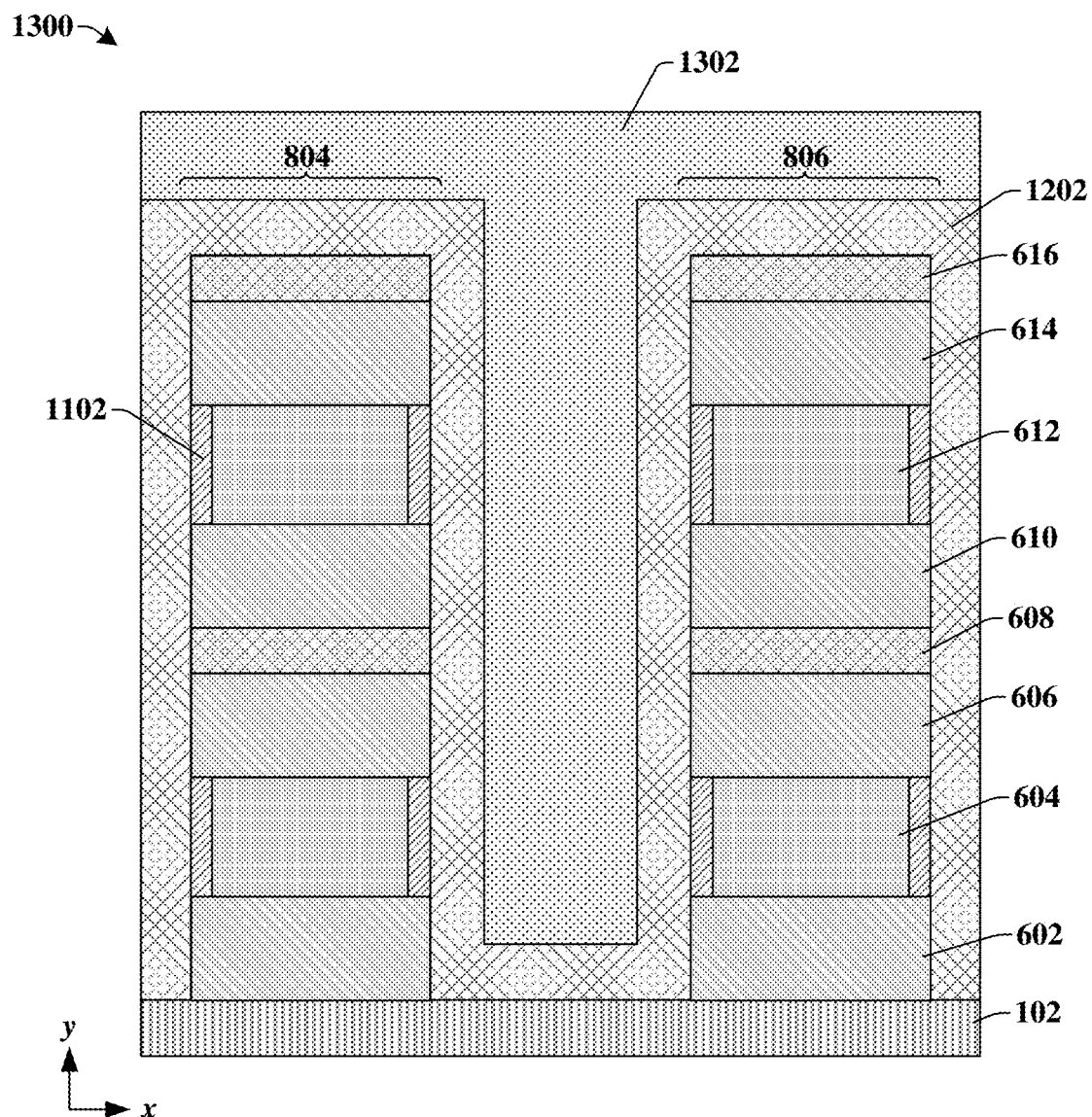

As shown in cross-sectional view 1300 of FIG. 13, in some embodiments, a gate electrode material 1302 is formed over the gate dielectric material 1202 and within the trench (802 of FIG. 12). Thus, the gate electrode material 1302 and the gate dielectric material 1202 completely fill the space between the first and second stacks of layers 804, 806 in the x-direction. In some embodiments, the gate electrode material 1302 is formed by way of a deposition process (e.g., CVD, PVD, PE-CVD, ALD, sputtering, etc.). In some embodiments, the gate electrode material 1302 comprises a semiconductor material such as polysilicon or a conductive material such as, for example, titanium nitride, tungsten, or some other suitable conductive material.

Figure 14:
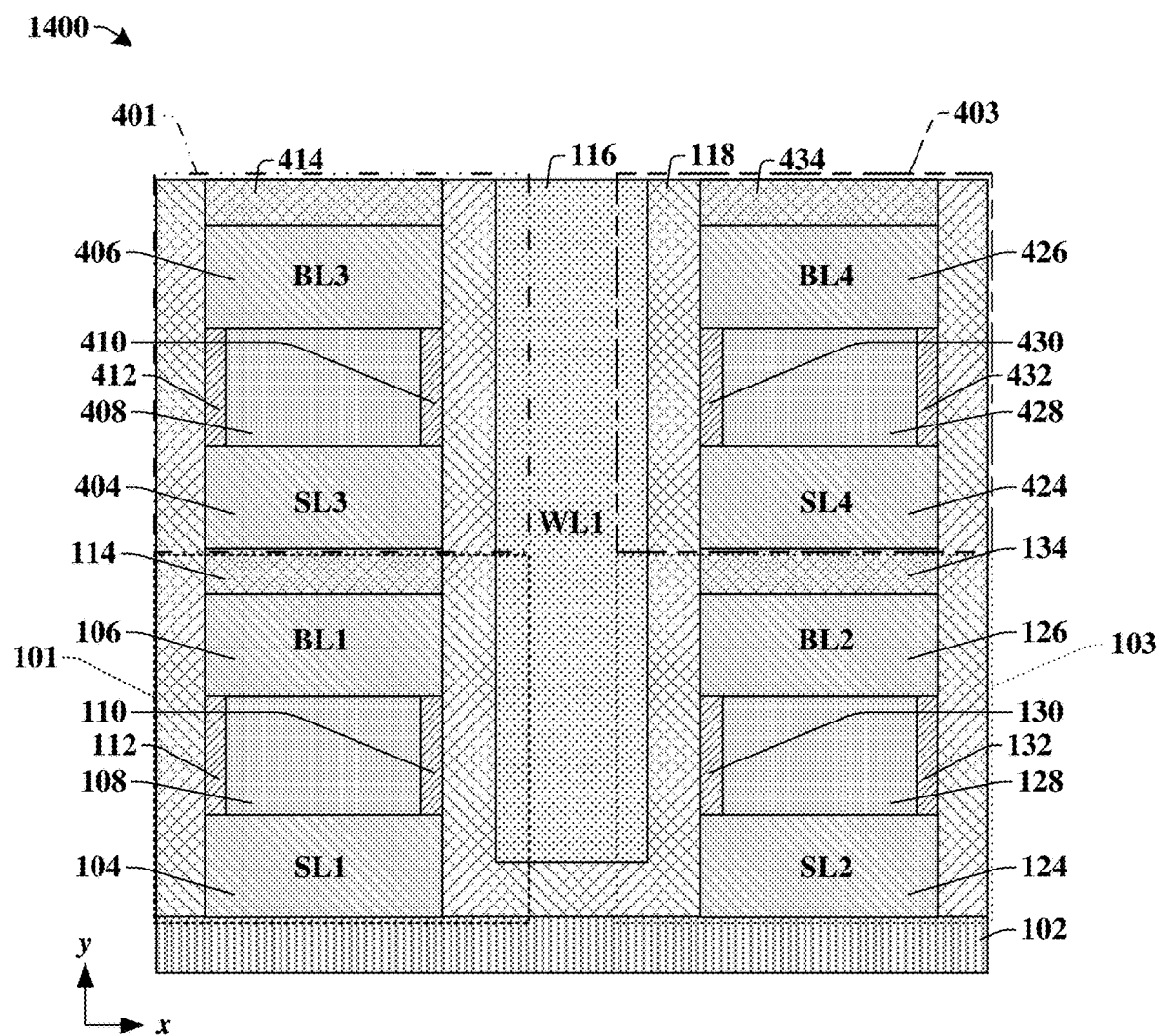

As shown in cross-sectional view 1400 of FIG. 14, a fourth removal process may be performed to remove portions of the gate dielectric material (1202 of FIG. 13) and the gate electrode material (1302 of FIG. 13) that are arranged above the fourth dielectric layer (616 of FIG. 13) to form a gate dielectric layer 118 surrounding a vertical gate electrode 116. Further, the vertical gate electrode 116 separates a first vertical fuse one-time program (OTP) transistor 101 from a second vertical fuse OTP transistor 103 and separates a third vertical fuse OTP transistor 401 from a fourth vertical fuse OTP transistor 403. The resulting OTP memory device comprises a 2 vertical fuse OTP transistor by a 2 vertical fuse OTP transistor vertical fuse OTP memory array. It will be appreciated that the method illustrated in FIGS. 6-14 may be modified to form other sized vertical fuse OTP memory arrays.

In such embodiments, the first vertical fuse OTP transistor 101 comprises the first and second conductive layers (602, 606 of FIG. 13) and the first and second dielectric layers (604, 608 of FIG. 13) from the first stack of layers (804 of FIG. 13). In such embodiments, the first conductive layer (602 of FIG. 13) of the first stack of layers (804 of FIG. 13) forms a first source/drain region 104 that corresponds to a first source-line SL1, and the second conductive layer (606 of FIG. 13) of the first stack of layers forms a second source/drain region 106 that corresponds to a first bit-line BL1. Further, the first dielectric layer (604 of FIG. 13) of the first stack of layers (804 of FIG. 13) forms a first channel isolation structure 108, wherein the channel structures (1102 of FIG. 13) surrounding the first channel isolation structure 108 correspond to first and second channel structures 110, 112 of the first vertical fuse OTP transistor 101. Further, the second dielectric layer (608 of FIG. 13) of the first stack of layers (804 of FIG. 13) corresponds to a first dielectric isolation structure 114.

Similarly, in some embodiments, the second OTP vertical fuse transistor 103 comprises a third source/drain region 124/second source-line SL2, a fourth source/drain region 126/second bit-line BL2, a second channel isolation structure 128, third and fourth channel structures 130, 132, and a second dielectric isolation structure 134 respectively formed from the first conductive layer (602 of FIG. 13), the second conductive layer (606 of FIG. 13), the first dielectric layer (604 of FIG. 13), the channel structures (1102 of FIG. 13), and the second dielectric layer (608 of FIG. 13) of the second stack of layers (806 of FIG. 13).

In some embodiments, the third vertical fuse OTP transistor 401 is formed directly over the first dielectric isolation structure 114 of the first vertical fuse OTP transistor 101. In such embodiments, the third vertical fuse OTP transistor 401 comprises a fifth source/drain region 404/third source-line SL3, a sixth source/drain region 406/third bit-line BL3, a third channel isolation structure 408, fifth and sixth channel structures 410, 412, and a third dielectric isolation structure 414 respectively formed from the third conductive layer (610 of FIG. 13), the fourth conductive layer (614 of FIG. 13), the third dielectric layer (612 of FIG. 13), the channel structures (1102 of FIG. 13), and the fourth dielectric layer (616 of FIG. 13) of the first stack of layers (804 of FIG. 13).

In some embodiments, the fourth vertical fuse OTP transistor 403 is formed directly over the second dielectric isolation structure 134 of the second vertical fuse OTP transistor 103. In some embodiments, the fourth vertical fuse OTP transistor 403 comprises a seventh source/drain region 424/fourth source-line SL4, an eighth source/drain region 426/fourth bit-line BL4, a fourth channel isolation structure 428, seventh and eighth channel structures 430, 432, and a fourth dielectric isolation structure 434 respectively formed from the third conductive layer (610 of FIG. 13), the fourth conductive layer (614 of FIG. 13), the third dielectric layer (612 of FIG. 13), the channel structures (1102 of FIG. 13), and the fourth dielectric layer (616 of FIG. 13) of the second stack of layers (806 of FIG. 13).

Thus, in such embodiments, the first, second, third, and fourth vertical fuse OTP transistors 101, 103, 401, 403 comprise vertically arranged source/drain regions (e.g., 104, 106, 124, 126, 404, 406, 424, 426), vertically arranged channel structures (e.g., 110, 130, 410, 430), and a shared vertical gate electrode 116 to increase overall OTP memory device density. Further, the source/drain regions (e.g., 104, 106, 124, 126, 404, 406, 424, 426) may serve as bit-lines (e.g., BL1, BL2, BL3, BL4) and source-lines (e.g., SL1, SL2, SL3, SL4), and the vertical gate electrode 116 may serve as a first word-line WL1 to reduce materials and manufacturing costs, while also conserving space in the y-direction to increase overall OTP memory device density.

FIG. 15 illustrates a flow diagram of some embodiments of a method 1500 of forming a vertical fuse OTP memory array comprising 2 vertical fuse OTP memory cells by 2 vertical fuse OTP memory cells.

While method 1500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 6:
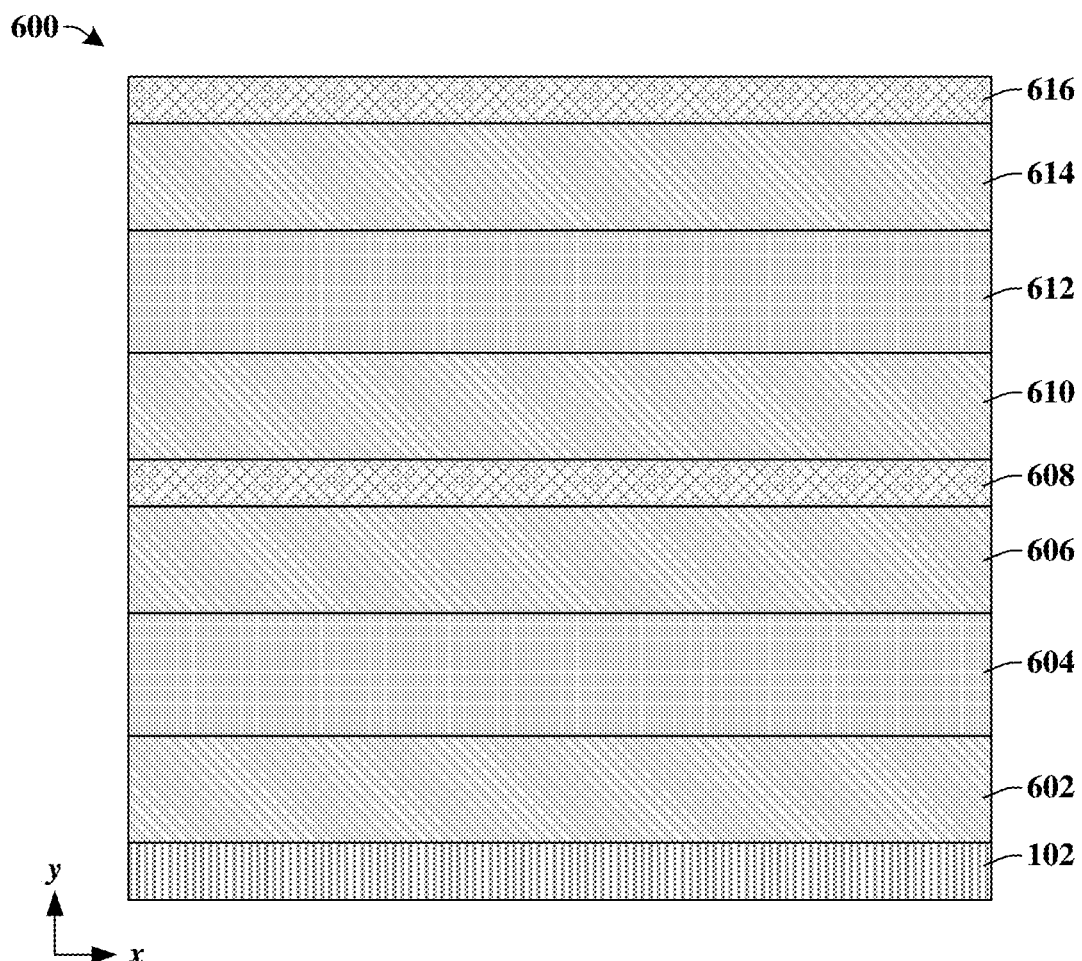
FIGS. 6-14 illustrate cross-sectional views of some embodiments of a method of forming vertical fuse OTP memory cells arranged in a 2 by 2 vertical fuse OTP memory array.

At act 1502, a first conductive layer is formed over a bottom dielectric layer; a first dielectric layer is formed over the first conductive layer; a second conductive layer is formed over the first dielectric layer; and a second dielectric layer is formed over the second conductive layer. FIG. 6 illustrates a cross-sectional view 600 of some embodiments corresponding to act 1502.

At act 1504, outer and middle portions of the first conductive layer, the first dielectric layer, the second conductive layer, and the second dielectric layer are removed to form a first stack of layers and a second stack of layers spaced apart by a trench. FIG. 8 illustrates a cross-sectional view 800 of some embodiments corresponding to act 1504.

At act 1506, an isotropic removal process is performed to remove outer exposed portions of the first dielectric layers of the first and second stacks of layers. FIG. 9 illustrates a cross-sectional view 900 of some embodiments corresponding to act 1506.

At act 1508, a channel material is formed that directly contacts the first dielectric layers of the first and second stacks of layers. FIG. 10 illustrates a cross-sectional view 1000 of some embodiments corresponding to act 1508.

At act 1510, portions of the channel material that do not directly underlie the second dielectric layers of the first and second stacks of layers are removed to form channel structures on the first dielectric layers of the first and second stacks of layers and to reopen the trench between the first and second stacks of layers. FIG. 11 illustrates a cross-sectional view of some embodiments corresponding to act 1510.

At act 1512, a gate dielectric layer is formed on sidewalls of the first and second stacks of layers. FIG. 12 illustrates a cross-sectional view 1200 of some embodiments corresponding to act 1512.

At act 1514, the trench is filled with a gate electrode material. FIG. 13 illustrates a cross-sectional view 1300 of some embodiments corresponding to act 1514.

At act 1516, portions of the gate dielectric layer and the gate electrode material that are arranged above the first and second stacks of layers are removed. FIG. 14 illustrates a cross-sectional view 1400 of some embodiments corresponding to act 1516.

Therefore, the present disclosure relates to a vertical fuse OTP memory array having multiple vertically arranged vertical fuse OTP transistors sharing a same vertical gate electrode to increase device density and reduce costs while maintaining device reliability.

Accordingly, in some embodiments, the present disclosure relates to a one-time program (OTP) memory device, comprising: a source-line arranged over a bottom dielectric layer; a bit-line arranged directly over the source-line in a first direction; a channel isolation structure arranged directly between the source-line and the bit-line; a channel structure arranged between the source-line and the bit-line and arranged beside the channel isolation structure in a second direction perpendicular to the first direction; a vertical gate electrode extending in the first direction from the bottom dielectric layer to the bit-line and arranged beside the channel isolation structure in the second direction; and a gate dielectric layer arranged between the vertical gate electrode and the bit-line, the source-line, and the channel structure.

In other embodiments, the present disclosure relates to a memory array, comprising: a first one-time program (OTP) memory cell, comprising: a first bit-line (BL) vertically arranged directly over a first source-line (SL), a first channel structure separating the first BL from the first SL, and a vertical gate electrode laterally beside the first BL, the first SL, and the first channel structure; and a second OTP memory cell arranged laterally beside the first OTP memory cell, separated from the first OTP memory cell by the vertical gate electrode, and comprising: a second BL vertically arranged directly over a second SL, and a second channel structure separating the second BL from the second SL.

In yet other embodiments, the present disclosure relates to a method of forming a one-time program (OTP) memory device: forming a first conductive layer over a bottom dielectric layer, a first dielectric layer over the first conductive layer, a second conductive layer over the first dielectric layer, and a second dielectric layer over the second conductive layer; removing outer portions and a middle portion of the first conductive layer, the first dielectric layer, the second conductive layer, and the second dielectric layer to form a first stack of layers and a second stack of layers over the bottom dielectric layer, wherein a trench separates the first stack of layers from the second stack of layers; performing an isotropic removal process to remove outer exposed portions of the first dielectric layers of the first and second stacks of layers; forming a channel material surrounding the first and second stacks of layers, and directly contacting the first dielectric layers of the first and second stacks of layers;

removing portions of the channel material that do not directly underlie the second dielectric layers of the first and second stacks of layers to form channel structures on the first dielectric layers of the first and second stacks of layers and to reopen the trench between the first and second stacks of layers; forming a gate dielectric layer on sidewalls of the first stack of layers and on the second stack of layers; filling the trench with a gate electrode material; and removing portions of the gate dielectric layer and the gate electrode material that are arranged above the first and second stacks of layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A one-time program (OTP) memory device, comprising:
   a source-line arranged over a bottom dielectric layer;
   a bit-line;
   a channel isolation structure arranged directly between the source-line and the bit-line along a first direction;
   a channel structure arranged between the source-line and the bit-line along the first direction and further arranged beside the channel isolation structure in a second direction perpendicular to the first direction;
   a vertical gate electrode extending in the first direction from the bottom dielectric layer to the bit-line and arranged beside the channel isolation structure in the second direction; and
   a gate dielectric layer arranged between the vertical gate electrode and the bit-line, the source-line, and the channel structure.

2. The OTP memory device of claim 1, wherein the channel structure directly contacts the bit-line, the source-line, the channel isolation structure, and the gate dielectric layer.

3. The OTP memory device of claim 1, wherein the channel structure is arranged on a first side of the channel isolation structure, and further comprising:
   an additional channel structure arranged between the source-line and the bit-line and arranged on a second side of the channel isolation structure, wherein the additional channel structure is separated from the channel structure in the second direction by the channel isolation structure.

4. The OTP memory device of claim 1, further comprising:
   a dielectric isolation structure arranged directly over the bit-line and arranged beside the gate dielectric layer in the second direction.

5. The OTP memory device of claim 4, further comprising:
   an additional source-line overlying the dielectric isolation structure in the first direction;
   an additional bit-line;
   an additional channel isolation structure arranged directly between the additional source-line and the additional bit-line along the first direction; and
   an additional channel structure arranged between the additional source-line and the additional bit-line and arranged beside the additional channel isolation structure in the second direction,
   wherein the vertical gate electrode extends in the first direction from the bottom dielectric layer to the additional bit-line.

6. The OTP memory device of claim 1, wherein the source-line, the bit-line, the channel isolation structure, and the channel structure are arranged on a first side of the vertical gate electrode, and wherein the OTP memory device further comprises:
   an additional source-line arranged over the bottom dielectric layer;
   an additional bit-line;
   an additional channel isolation structure arranged directly between the additional source-line and the additional bit-line; and
   an additional channel structure arranged between the additional source-line and the additional bit-line and arranged beside the additional channel isolation structure in the second direction,
   wherein the additional source-line, the additional bit-line, the additional channel isolation structure, and the additional channel structure are arranged on a second side of the vertical gate electrode.

7. The OTP memory device of claim 6, wherein the gate dielectric layer is arranged between the second side of the vertical gate electrode and the additional source-line, the additional bit-line, the additional channel isolation structure, and the additional channel structure.

8. A one-time program (OTP) memory device, comprising:
   a source-line arranged over a bottom dielectric layer;
   a bit-line;
   a channel isolation structure arranged between a top of the source-line and a bottom of the bit-line;
   a channel structure arranged between the source-line and the bit-line and along an outermost sidewall of the channel isolation structure;
   a gate dielectric arranged along sidewalls of the source-line, the channel structure, and the bit-line; and
   a gate electrode extending along a sidewall of the gate dielectric from vertically below the channel structure to vertically above the channel structure.

9. The OTP memory device of claim 8, wherein the gate dielectric continuously extends from along a first outermost sidewall of the gate electrode, to along a bottom surface of the gate electrode, and to along an opposing second outermost sidewall of the gate electrode.

10. The OTP memory device of claim 9, wherein the gate dielectric and the gate electrode have substantially planar upper surfaces.

11. The OTP memory device of claim 8, wherein the channel structure has opposing outermost sidewalls arranged between an outermost sidewall of the gate dielectric and the outermost sidewall of the channel isolation structure.

12. The OTP memory device of claim 8, wherein the channel structure comprises polysilicon or a metal.

13. The OTP memory device of claim 8, further comprising:

a first dielectric isolation structure arranged over the bit-line, wherein the gate dielectric is disposed along a first outermost sidewall of the first dielectric isolation structure; and an additional gate dielectric disposed along an opposing second outermost sidewall of the first dielectric isolation structure.

14. The OTP memory device of claim 13, further comprising:

a second source-line arranged over the first dielectric isolation structure;

a second bit-line;

a second channel isolation structure arranged directly between the second source-line and the second bit-line; and a second channel structure arranged directly between the second source-line and the second bit-line and along an outermost sidewall of the second channel isolation structure that faces the gate dielectric.

15. The OTP memory device of claim 14, wherein the gate dielectric and the gate electrode extend along sidewalls of the second source-line, the second channel structure, and the second bit-line.

16. The OTP memory device of claim 8, wherein the channel structure is configured to be damaged during operation to store a data state.

17. A one-time program (OTP) memory device, comprising:

a source arranged over a substrate;

a drain;

a channel isolation dielectric, the channel isolation dielectric being directly over the source and the drain being directly over the channel isolation dielectric, wherein the channel isolation dielectric is laterally recessed from sidewalls of the source and the drain to form a recess below the drain;

a channel layer arranged within the recess;

a gate dielectric disposed on the sidewalls of the source and the drain, and a sidewall of the channel layer; and a gate electrode extending along a sidewall of the gate dielectric from below the channel layer to above the drain.

18. The OTP memory device of claim 17, wherein the channel layer is configured to be substantially irreversibly damaged to store a data state.

19. The OTP memory device of claim 17, further comprising:

a second source arranged over the substrate;

a second drain arranged over the second source;

a second channel isolation dielectric arranged directly between the second source and the second drain, wherein the second channel isolation dielectric is laterally recessed from sidewalls of the second source and the second drain to form a second recess below the second drain; and a second channel layer arranged within the second recess, wherein the gate dielectric is arranged between the gate electrode and the second source, the second channel layer, and the second drain.

20. The OTP memory device of claim 17, further comprising:

a second channel layer arranged on an outermost sidewall of the channel isolation dielectric that faces away from the gate dielectric;

a second gate dielectric disposed on second sidewalls of the source, the drain, and the second channel layer; and a second gate electrode extending along a sidewall of the second gate dielectric from below the second channel layer to above the drain.

* * * * *